(12) United States Patent
Kneer et al.

(10) Patent No.: US 7,408,621 B2
(45) Date of Patent: Aug. 5, 2008

(54) PROJECTION EXPOSURE SYSTEM

(75) Inventors: Bernhard Kneer, Altheim (DE); Gerald Richter, Abtsgmünd (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/396,051

(22) Filed: Mar. 31, 2006

(65) Prior Publication Data

US 2006/0170897 A1 Aug. 3, 2006

Related U.S. Application Data

(63) Continuation of application No. 10/233,314, filed on Aug. 30, 2002.

(51) Int. Cl.
*G03B 27/54* (2006.01)
*G03B 27/42* (2006.01)
*G02B 9/60* (2006.01)

(52) U.S. Cl. .............................. 355/67; 355/53; 359/766

(58) Field of Classification Search .................. 355/53, 355/67, 55; 372/38.01; 359/683, 649, 687, 359/479, 758, 760, 766, 690; 353/31
See application file for complete search history.

(56) References Cited

U.S. PATENT DOCUMENTS

| 4,765,722 | A |   | 8/1988  | Aono           |         |
|-----------|---|---|---------|----------------|---------|
| 4,787,718 | A |   | 11/1988 | Cho            |         |
| 4,787,719 | A |   | 11/1988 | Imai           |         |
| 5,526,186 | A | * | 6/1996  | Sekine         | 359/683 |
| 5,636,000 | A |   | 6/1997  | Ushida et al.  |         |
| 5,831,700 | A |   | 11/1998 | Li et al.      |         |
| 5,831,770 | A |   | 11/1998 | Matsuzawa et al. |       |
| 5,930,032 | A |   | 7/1999  | Maruyama et al. |        |
| 6,014,455 | A |   | 1/2000  | Sumiyoshi et al. |       |

(Continued)

FOREIGN PATENT DOCUMENTS

DE    198 55 108 A1    5/2000

(Continued)

*Primary Examiner*—Peter B Kim
(74) *Attorney, Agent, or Firm*—Fish & Richardson P.C.

(57) ABSTRACT

A projection exposure system, intended in particular for microlithography, is used for generating, in an image plane, an image of a mask arranged in an object plane. The projection exposure system has a light source emitting projection light and projection optics arranged between the mask and the image. Starting from the mask, the following are arranged in the beam path of the projection optics: a first group of optical components with an overall positive refractive power; a second group of optical components with an overall negative refractive power; a third group of optical components with an overall positive refractive power; a fourth group of optical components with an overall negative refractive power, and, a fifth group of optical components with an overall positive refractive power. At least three optical subgroups having at least one optical component can be displaced along the optical axis of the projection optics. The first optical subgroup comprises the mask or at least one optical component from the first group of optical components. The second optical subgroup comprises at least one optical component from the second or the third group of optical components. The third optical subgroup comprises at least one optical component from the third or the fourth group of optical components. With such subgroups, efficient imaging error correction of the projection optics is possible.

14 Claims, 3 Drawing Sheets

U.S. PATENT DOCUMENTS

| | | |
|---|---|---|
| 6,061,180 A | 5/2000 | Hayakawa |
| 6,078,380 A * | 6/2000 | Taniguchi et al. ............. 355/52 |
| 6,091,551 A | 7/2000 | Watanabe |
| 6,256,086 B1 * | 7/2001 | Sumiyoshi ................... 355/55 |
| 6,268,903 B1 | 7/2001 | Chiba et al. |
| 6,333,781 B1 | 12/2001 | Shigematsu |
| 6,349,005 B1 | 2/2002 | Schuster et al. |
| 2002/0101892 A1 * | 8/2002 | Ouchi .................... 372/38.01 |
| 2002/0149855 A1 | 10/2002 | Schuster |
| 2003/0007138 A1 * | 1/2003 | Shigematsu et al. .......... 355/67 |
| 2004/0144915 A1 | 7/2004 | Wagner et al. |

FOREIGN PATENT DOCUMENTS

| | | |
|---|---|---|
| DE | 199 42 281 A1 | 11/2000 |
| EP | 0992 853 A2 | 4/2000 |

* cited by examiner

PROJECTION EXPOSURE SYSTEM

CROSS-REFERENCE TO RELATED APPLICATIONS

This application is a continuation application of and claims priority to U.S. application Ser. No. 10/233,314, filed on Aug. 30, 2002, which claims the benefit of German Patent Application Serial No. 101 43 385.9, filed Sep. 5, 2001. The contents of both of these applications are hereby incorporated by reference.

BACKGROUND OF THE INVENTION

The invention relates to a projection exposure system, in particular for microlithography, for generating, in an image plane, an image of a mask arranged in an object plane, with a light source emitting projection light and projection optics arranged between the mask and the image, wherein the following are arranged in the beam path of the projection optics, starting from the mask:
   a) a first group of optical components with an overall positive refractive power;
   b) a second group of optical components with an overall negative refractive power;
   c) a third group of optical components with an overall positive refractive power;
   d) a fourth group of optical components with an overall negative refractive power and
   e) a fifth group of optical components with an overall positive refractive power.

Such projection optics are known from U.S. Pat. No. 6,349,005 B1 and U.S. Pub. No. 2003/1498551 A1 in the name of the Applicant. They are suitable, in particular, for use with projection light wavelengths in the DUV wavelength range. Instead of the fifth group of optical components with an overall positive refractive power, these documents also refer in places to a fifth and a sixth group of optical components, although these may be combined as a fifth group of optical components with an overall positive refractive power for the purposes of the invention described below.

Owing to the very high numerical aperture which projection optics of this type generally have, residual imaging errors occur, for example because of changes in the ambient parameters such as temperature and air pressure.

It is therefore an object of the present invention to provide projection optics for a projection exposure system of the type mentioned in the introduction, whose residual imaging errors are reduced.

This object is achieved according to the invention by the fact that
   f) at least three (first, second and third) optical subgroups each having at least one optical component can be displaced along an optical axis of the projection optics, wherein
   g) the first optical subgroup comprises one of the mask and at least one optical component from the first group of optical components,
   h) the second optical subgroup comprises at least one optical component from one of the second and the third group of optical components,
   i) the third optical subgroup comprises at least one optical component from one of the third and the fourth group of optical components.

According to the invention, it has been discovered that if at least three optical subgroups according to the above selection are chosen as instruments, which can be displaced along the optical axis, for correction of imaging errors of the projection optics, then good correction is ensured for the imaging errors which typically occur, for example scaling, distortion and image field curvature. In this case, the individual subgroups need not act selectively on one imaging error in each case, but rather it is sufficient for the combination of the actions of the three subgroups to bring about the desired correction effect. The optimum adjustment of the respective subgroups can be determined with the aid of known optical design programs.

Preferably, the second optical subgroup is arranged next to the first group of optical components. In this case, at least two displaceable subgroups are present in spatial proximity, which offers the possibility of simplifying the design of the projection optics.

The third optical subgroup may be arranged in the transition region between the third and the fourth groups of optical components. For most designs of projection optics of the type mentioned in the introduction, good correction of imaging errors which typically occur is obtained in this case.

A pair of optical components, whose displacements along the optical axis are expediently coupled together, may be provided as the second optical subgroup. Such a component pair has been found to be efficient in terms of optical corrective action, as has been shown by optical calculations.

Preferably, a support body is in this case provided, which can be displaced along the optical axis of the projection optics and which supports the pair of optical components together.

This permits a simple mechanical structure for the optical components which can be displaced together.

An instrument for adjusting the wavelength may additionally be provided. According to the invention, it has been established that an instrument for adjusting the wavelength can in many cases fulfil the corrective function of an additional displaceable subgroup of optical components. In most cases, the wavelength adjustment means is easier to produce than an additional displaceable subgroup.

Preferably, the adjustment instrument includes means for altering the emission wavelength of the light source. Such an adjustment instrument is energy-efficient.

As an alternative or in addition, the adjustment instrument may include means for altering the projection light wavelength after exiting the light source. Such an adjustment instrument is easy to produce, for example by means of colour filters.

In a preferred refinement, at least a fourth optical subgroup, having at least one optical component, is provided which can be displaced along the optical axis and which comprises at least one optical component from the fifth group of optical components. With such an additional optical subgroup, it is possible to reduce other imaging errors which typically occur, such as coma and spherical aberration.

The at least a fourth optical subgroup may comprise an at most fourth and a fifth optical subgroup. With comparatively minor mechanical outlay, such an embodiment provides good reduction of imaging errors which occur, as has been shown by optical calculations.

The optical components may be designed as refractive components. With refractive optical components, it is possible to produce projection optics of the type mentioned in the introduction with comparatively minor mechanical outlay. As an alternative, however, it is likewise possible to embody the projection optics with reflective components.

BRIEF DESCRIPTION OF THE DRAWINGS

Exemplary embodiments of the invention will be explained in more detail below with the aid of the drawing, in which.

DETAILED DESCRIPTION OF THE DRAWINGS

Figure 1:
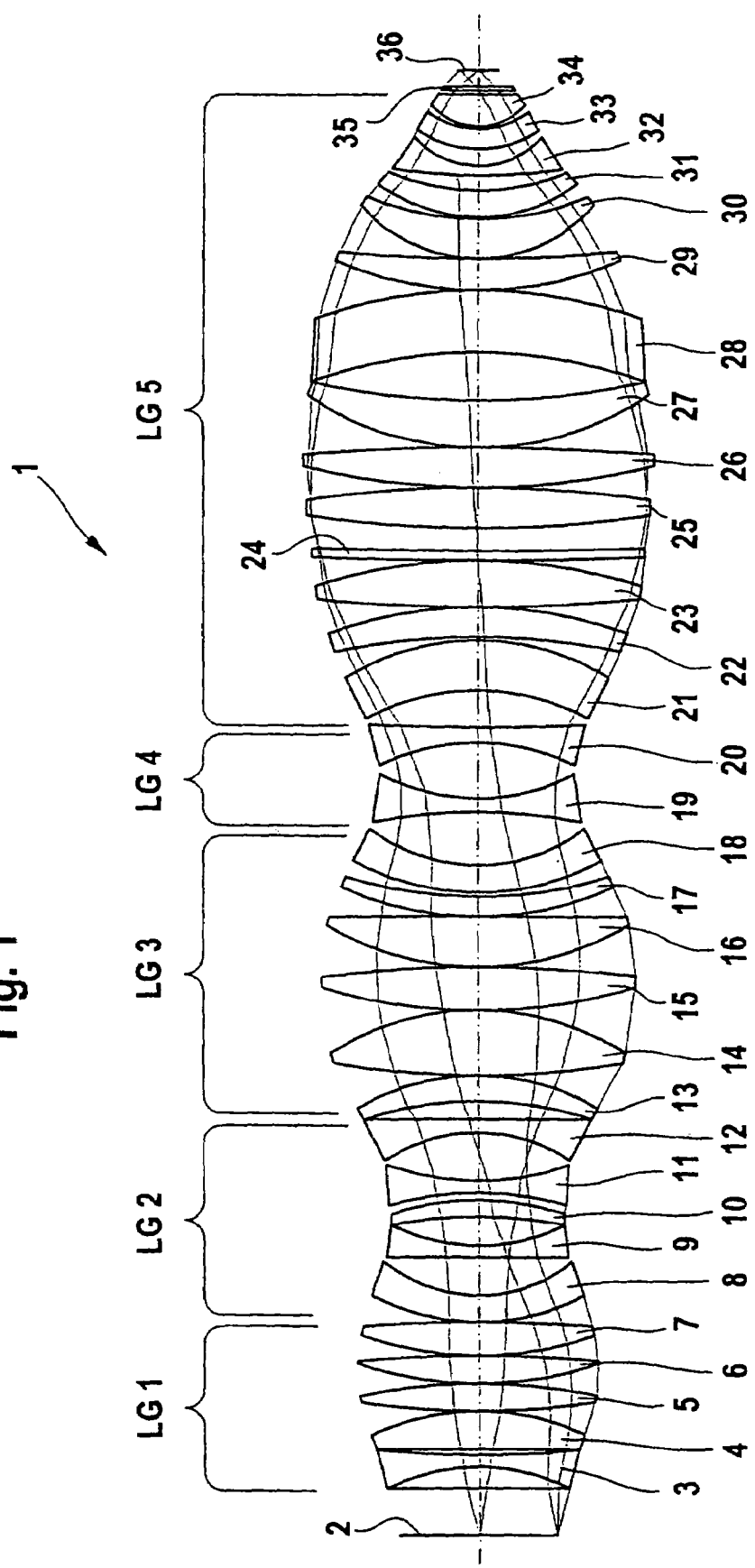
FIG. 1 shows a lens section of a projection objective of a projection exposure system.

While this invention is susceptible of embodiment in many different forms, there is shown in the drawings and will be described in detail, several specific embodiments with the understanding that the present disclosure is to be considered as an exemplification of the principles of the invention and is not intended to limit the invention to the embodiments illustrated.

The projection objectives described below with the aid of their lens designs are used in the scope of microlithography projection exposure in order for an image of a structure located on a mask to be formed onto a wafer, the image of the structure lying in a corrected image field of the projection objective. The projection objectives which are shown are refractive systems, and all the lenses used there are made of quartz glass. The projection objectives are designed for operation with the wavelength of a KrF excimer laser at 248 nm. The beam paths, through the objective, of two pencils of rays respectively starting from an object point are represented in the following figures for illustration.

In the first exemplary embodiment of the projection objective denoted overall by the reference number 1 in FIG. 1, whose lens data are published in Table 3 of U.S. Pat. No. 6,349.005 B1 to which reference is hereby made, a mask 2 is arranged in the object plane of the projection objective.

A first lens group LG1 with an overall positive refractive power, which has five lenses 3, 4, 5, 6 and 7 in all, is arranged behind the mask 2 in the beam direction of the projection light pencil.

In the projection beam direction, the first lens group LG1 with an overall positive refractive power is adjoined by a second lens group LG2 with an overall negative refractive power, which likewise comprises five lenses 8, 9, 10, 11, 12. The second lens group LG2 is followed by a third lens group LG3 with an overall positive refractive power, comprising six lenses 13, 14, 15, 16, 17, 18 in all. This is adjoined by a fourth lens group LG4 with an overall negative refractive power and two lenses 19, 20. The remaining optical components of the projection objective 1 can be combined into a fifth lens group LG5 with an overall positive refractive power. This has, in the projection beam direction, firstly three lenses 21, 22, 23, which are followed by a plane-parallel plate 24. Continuing in the projection beam direction, ten lenses 25, 26, 27, 28, 29, 30, 31, 32, 33, 34 follow. The projection objective 1 is terminated, towards a wafer 36 situated in the image plane of the projection objective 1, by a further plane-parallel plate 35.

With reference to the lens design of FIG. 1, various embodiments of projection objectives with this lens design will be described below, which in each case have various combinations of instruments for correction of imaging errors. The correction components comprise a plurality of subgroups of optical components, in each case comprising at least one optical component, which can be displaced in the direction of the optical axis.

All these exemplary embodiments, as well as the embodiments of projection optics with correction instruments described in connection with the following figures, have the following structure in common:

The mask 2, or at least one lens from the first lens group LG1, can be displaced in the direction of the optical axis. The mask 2 and the lenses from the lens group LG1 can therefore be regarded as belonging to a first subgroup of optical components Independently of this, at least one lens from the second or the third lens group LG2, LG3 can be displaced in the direction of the optical axis. These lenses from the second or the third lens group LG2, LG3 can therefore be regarded as belonging to a second subgroup of optical components.

Lastly, at least one lens from the third or the fourth lens group LG3, LG4 can also be displaced in the direction of the optical axis. These lenses from the third or the fourth lens group LG3, LG4 can therefore be regarded as belonging to a third subgroup of optical components.

With the correction instruments common to all the exemplary embodiments, it possible to compensate for the image errors of scaling, distortion and image field curvature, as will be shown more quantitatively below.

In addition to the said correction instruments, depending on the exemplary embodiment, it is possible to provide correction instruments which, on the one hand, are used to optimise the compensation for the said image errors and, on the other hand, can additionally influence the image errors of coma and spherical aberration as well. Besides manipulation of optical components in the direction of the optical axis, alteration of the projection light wavelength is also in principle viable for this.

The effectiveness of the individual exemplary embodiments will be discussed with the aid of the value of a merit function, which is obtained from the sum of the squares of the Zernike coefficients, summed over the image field points. These merit functions can be evaluated with the aid of an optical design program.

In order to assess the effectiveness, a particular combination of image errors is specified, and the extent to which it is possible to compensate for these, with the aid of the correction instruments specified according to the respective exemplary embodiment, is then quantitatively determined.

In a first exemplary embodiment, the reticle holding the mask 2, the lenses 8 and 9 as well as the lens 17 can be displaced in the direction of the optical axis in the projection objective 1. The lenses 8 and 9 can in this case be displaced not independently of one another, but rather together as a group. To that end, the lenses 8 and 9 can be displaced together on a support body (not shown in the drawing) which is arranged so that it can be displaced along the optical axis.

For the correction instruments according to the first exemplary embodiment, the following image error values were used as starting values to determine the corrective action: 50 ppm for the scaling, 50 nm for the distortion and 100 nm for the image field curvature coupled in the ratio 1:1 to 100 nm of astigmatism, since these image errors can be corrected only simultaneously by Z manipulators. With the aid of the correction instruments according to the first exemplary embodiment, the value of the merit function for these starting values can be reduced to an end value whose absolute value now amounts to only 1.9% of the starting value.

The statistical sums over the residual image errors after compensation for the three said starting image errors by the correction instruments of the first exemplary embodiment are represented in the first row of Table 1, which is given at the end of the Description. Here, the values for the distortion (Disto), focal plane deviation (FPD), astigmatism (AST) as geometrical image errors, as well as the most important wavefront errors as Zernike coefficients (Z7, Z9, Z10, Z12, Z14, Z16, Z17, Z25), are indicated. The residual image error is the maximum value of an image error, for example distortion, in the image field. The residual image error is determined upon each compensation for a model image-error profile. The root of the sum of the squares of the individual residual image errors obtained from the compensations is formed during the statistical summation.

In the second exemplary embodiment, the projection objective 1 has, as correction instruments, lenses 6, 8, 9 and 17 which can be displaced in the direction of the optical axis. The reticle 2 is not displaceable here. The lenses 8 and 9 can here again be displaced in the direction of the optical axis not independently of one another, but rather together as a group. Similarly to the above comments in connection with the first exemplary embodiment, the reduction of the value of the merit function, as well as the residual image errors after compensation has been carried out, are here again calculated with the aid of the same starting values for the image errors of scaling, distortion and image field curvature. The merit function is reduced to 1.7% of the starting value.

The values for the residual image errors are entered in the second row of Table 1. The distortion value, in particular, is further reduced significantly in relation to the first exemplary embodiment.

In a third exemplary embodiment, the following correction instruments are used in the projection objective 1: A reticle which holds the mask 2 and can be displaced in the direction of the optical axis, lenses 8, 9, 17 and 31 which can be displaced in the direction of the optical axis, as well as a means of adjusting the wavelength of the projection light. Here again, the lenses 8 and 9 can be displaced not independently of one another but rather together as a group.

In this exemplary embodiment, a lens from the fifth lens group LG5 is hence additionally displaceable as well. These lenses from the fifth lens group LG5 can therefore be regarded as belonging to a further subgroup of optical components.

In order to adjust the wavelength of the projection light, the emission wavelength of the light source may be altered. In the case of a laser, this may be carried out, for example, using a dispersive optical element, for example a grating, which is internal to the resonator.

Alternatively, it is possible to alter the wavelength of the projection light after exiting the light source. This is done, for example, likewise using an adjustable dispersive optical element, for example a grating or a prism, which in this case is arranged externally with respect to the light source. The use of a colour filter to alter the wavelength is also possible.

If error values for coma (10 nm Z7) and spherical aberration (10 nm Z9) are also assumed here, in addition to the starting image error values for the scaling, the distortion and the image field curvature (cf. the first exemplary embodiment), then a reduction of the starting value of the merit function resulting in this case, after the compensation by the correction instruments of the second exemplary embodiment, is now obtained to only 0.78% of the starting value. The resulting residual image errors can be seen in the third a row of Table 1. In comparison with the first and second exemplary embodiments, the geometrical image errors are reduced significantly. In the case of the higher Zernike coefficients, a slight increase in the absolute values is obtained, which is primarily attributable to the additionally introduced error values for coma and spherical aberration.

In the fourth exemplary embodiment, the following are provided as correction instruments in the projection objective 1: A reticle which holds the mask 2 and can be displaced in the direction of the optical axis, displaceable lenses 8, 9, 17, 23 and 31. Here again, the lenses 8 and 9 can be displaced not independently of one another but rather together as a group. If the same starting image errors as in the third exemplary embodiment are assumed, a reduction of the merit function to 0.67% of the starting value is obtained. The residual image error data are entered in the fourth row of Table 1. Especially in the case of the higher Zernike coefficients, reductions of the absolute values in relation to the third exemplary embodiment are obtained here.

In a fifth exemplary embodiment, the following correction instruments are provided in the projection objective 1: Lenses 6, 8, 9, 17, 23 and 31 which can be displaced in the direction of the optical axis. The reticle 2 is not displaceable. Here again, the lenses 8 and 9 can be displaced not independently of one another but rather together as a group. A reduction of the merit function to 0.60% of the starting value is obtained here. The residual image error data are entered in the fifth row of Table 1. These data correspond approximately to those of the fourth exemplary embodiment.

Figure 2:
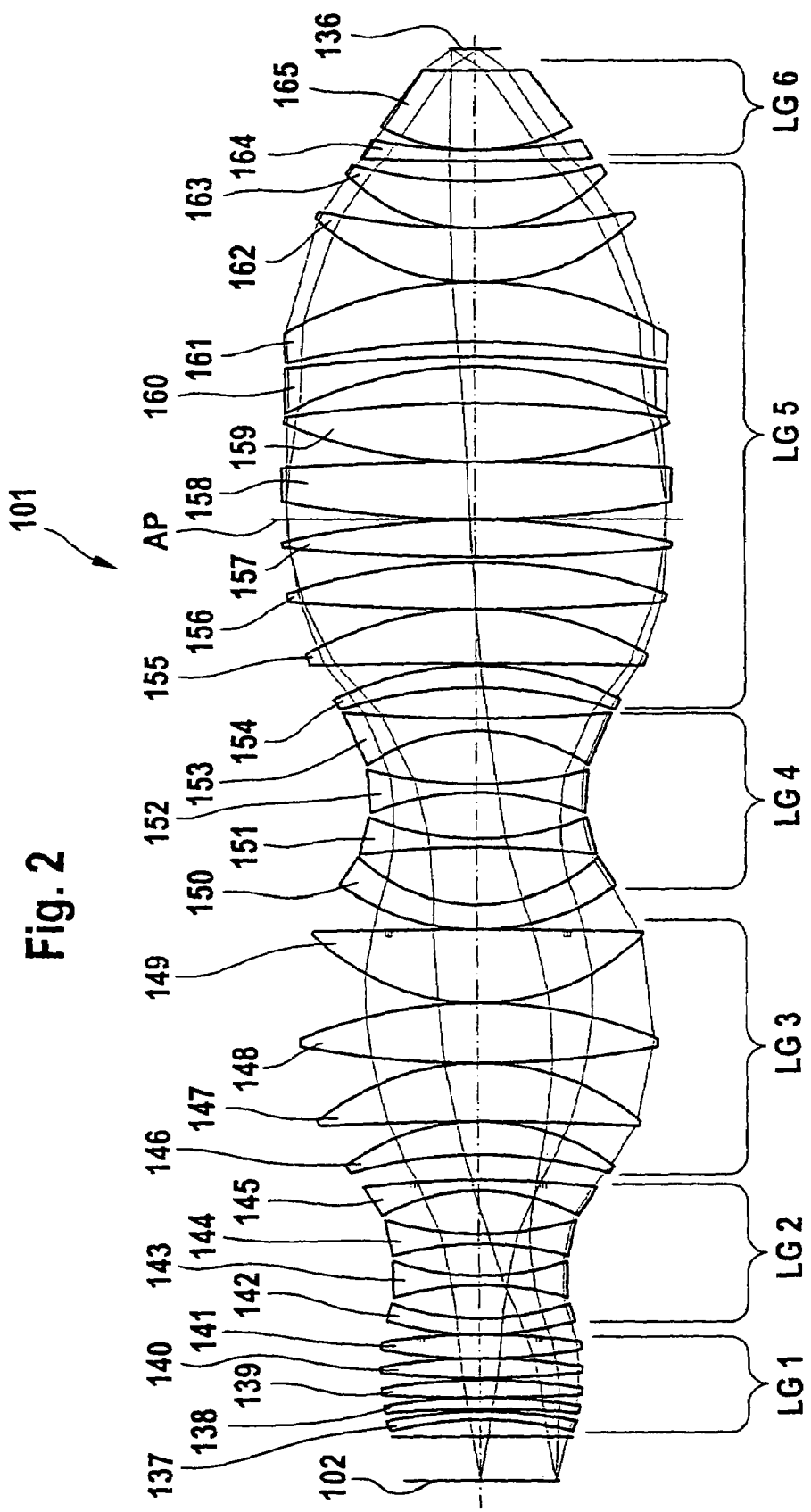
FIG. 2 shows a similar lens section to FIG. 1 of an alternative projection objective.

A second projection objective 101, for which a series of exemplary embodiments of correction instrument combinations will likewise be discussed below, is represented in FIG. 2. Components which correspond to those that have already been explained in connection with FIG. 1 carry reference numbers increased by 100, and they will not be explained in detail again.

The lens data for the projection objective 101 are disclosed in U.S. Pub. No. 2003/1498551 A Table 4, to which reference is hereby made.

The first lens group LG1 comprises, in the projection objective 101, five lenses 137, 138, 139, 140, 141. The second lens group LG2 is made up of four lenses 142, 143, 144, 145. The third lens group LG3 has four lenses 146, 147, 148, 149 in all. The fourth lens group LG4 comprises the four lenses 150, 151, 152, 153.

In contrast to the projection objective 1, the lenses following the lens group LG4 are, for their part, divided into two lens groups: The lens group LG4 is followed, in the projection beam direction, firstly by a lens group LG5 with an overall positive refractive power. It has 10 lenses 154, 155, 156, 157, 158, 159, 160, 161, 162, 163 in all. Between the lenses 157, 158, an aperture diaphragm AP is arranged in a pupil plane of the projection objective 101.

The lens group LG5 is followed, in the projection beam direction, by a lens group LG6, likewise with an overall positive refractive power. It has two lenses 164, 165 in all, the lens 164 having a negative refractive power. The last two lens groups LG5, LG6 can be considered as one lens group with an overall positive refractive power.

The lens 165 is next to the wafer 136.

In a sixth exemplary embodiment of a combination of correction instruments, the projection objective 101 of FIG. 2 has the following correction instruments: A reticle which holds the mask 102 and can be displaced in the direction of the optical axis, lenses 141, 142, 149 which can be displaced in the direction of the optical axis. The lenses 141, 142 are in this case displaceable not independently of one another but rather only together as a group.

In order to assess the effectiveness of these correction instruments, the same starting image errors for the scaling, the distortion and the image field curvature as previously in the first exemplary embodiment are again assumed. In the sixth exemplary embodiment, the merit function is reduced to 3.3% of the starting value. The residual image error data can be seen in the sixth row of Table 1.

In a seventh exemplary embodiment, the following correction instruments are present in the projection objective 101: Lenses 140, 141, 142 and 149 which can be displaced in the direction of the optical axis. The reticle 102 is not displaceable. The lenses 141, 142 are here again displaceable not independently of one another but rather together as a group. Assuming the starting image errors according to the first exemplary embodiment, a reduction of the merit function to 2.7% of the starting value is obtained here. The residual image error data are entered in the seventh row of Table 1.

In an eighth exemplary embodiment, the following correction instruments are present in the projection objective 101: A reticle which holds the mask 102 and can be displaced in the direction of the optical axis, displaceable lenses 140, 141, 142 and 149, as well as a means of adjusting the wavelength. The lenses 141, 142 are in this case displaceable not independently of one another but rather only together as a group.

Here again, as in exemplary embodiments 3 to 5, starting image errors for the coma (10 nm Z7) and the spherical aberration (10 nm Z9) are also assumed, in addition to the starting image errors for the scaling, the distortion and the image field curvature. In the eighth exemplary embodiment, a reduction of the merit function calculated for these starting image errors to 1.5% of the starting value is obtained after use of the correction instruments. The residual image error data are given in the eighth row of Table 1.

In a ninth exemplary embodiment, the projection objective 101 has the following correction instruments: A reticle which holds the mask 102 and can be displaced in the direction of the optical axis, lenses 140, 141, 142, 149 and 157 which can be displaced in the direction of the optical axis. Here again, the lenses 141, 142 are in this case displaceable not independently of one another but rather together as a group. Assuming the same starting image errors as in the eighth exemplary embodiment, a reduction of the merit function to 1.4% of the starting value is obtained here. The residual image error data are given in the ninth row of Table 1.

In a tenth exemplary embodiment, the following correction instruments are provided in the projection objective 101: Lenses 140, 141, 142, 149, 157, 159 which can be displaced in the direction of the optical axis. The reticle 102 is not displaceable. Here again, the lenses 141, 142 are displaceable not independently of one another but rather together as a group. Assuming starting image errors as in the eighth exemplary embodiment, a reduction of the merit function to 1.4% of the starting value is obtained here. The residual image error data are given in the tenth row of Table 1.

Figure 3:
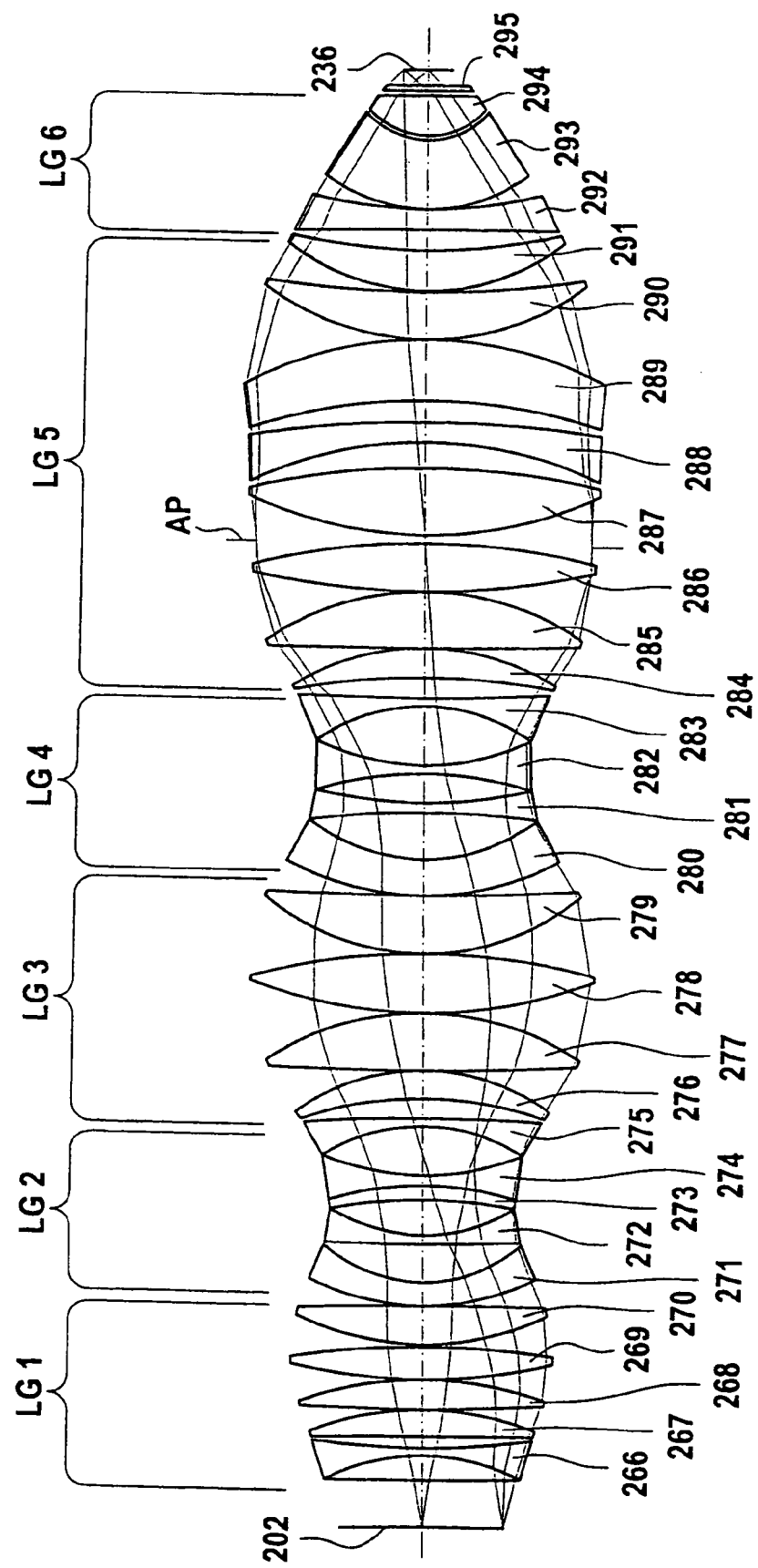
FIG. 3 shows a similar lens section to FIG. 1 of a further projection objective.

A third projection objective 201, for which further exemplary embodiments of combinations for correction instruments will be given below, is represented in FIG. 3. Components which correspond to those that have already been explained with reference to FIG. 1 or FIG. 2 carry reference numbers increased respectively by 200 and 100, and they will not be explained in detail again.

The lens data for the projection objective 201 are disclosed in U.S. Pub. No. 2003/1498551 A Table 1, to which reference is hereby made.

The first lens group LG1 of the projection objective 201 has five lenses 266, 267, 268, 269, 270 in all. The second lens group LG2 of the projection objective 201 is made up of five lenses 271, 272, 273, 274, 175 in all. The third lens group LG3 of the projection objective 201 comprises four lenses 276, 277, 278, 279 in all. The fourth lens group LG4 of the projection objective 201 has four lenses 280, 281, 282, 283 in all.

The projection objective 201 of FIG. 3 is constructed similarly to the projection objective 101 of FIG. 2 in respect of the lens groups LG5, LG6. The fifth lens group of the projection objective 201 comprises eight lenses 284, 285, 286, 287, 288, 289, 290, 291 in all. Between the lenses 286, 287, an aperture diaphragm AP is provided in the vicinity of a pupil plane of the projection objective 201. The sixth lens group LG6 of the projection objective 201 comprises, in the projection beam direction, firstly three lenses 292, 293, 294 as well as a plane-parallel plate 295 terminating the projection objective 201 in the direction of the wafer 236.

In an eleventh exemplary embodiment, the following correction instruments are provided in the projection objective 201 of FIG. 3: A reticle which holds the mask 202 and can be displaced in the direction of the optical axis, lenses 271, 272 and 280 which can be displaced in the direction of the optical axis. The lenses 271, 272 are displaceable not independently of one another but rather together as a group.

With the starting image errors for the scaling, the distortion and the image field curvature according to the first exemplary embodiment, a reduction of the merit function to 2.1% of the starting value is obtained here after the correction by the correction instruments. The residual image error data after the compensation are entered in the eleventh row of Table 1.

In the twelfth exemplary embodiment, the projection objective 201 has the following correction instruments: Lenses 269, 271, 272 and 280 which can be displaced in the direction of the optical axis. The reticle 202 is not displaceable. Here again, the lenses 271, 272 are displaceable not independently of one another but rather together as a group. With the starting image errors according to the first exemplary embodiment, a reduction of the merit function to 1.9% of the starting value is obtained here. The residual image error data are entered in the twelfth row of Table 1.

In the thirteenth exemplary embodiment, the following correction instruments are present in the projection objective 201: A reticle which supports the mask 202 and can be displaced in the direction of the optical axis, lenses 269, 271, 272 and 279 which can be displaced in the direction of the optical axis, as well as a means of adjusting the wavelength. Here again, the lenses 271, 272 are displaceable not independently of one another but rather together as a group. In the thirteenth exemplary embodiment, starting image errors for the coma (10 nm Z7) and the spherical aberration (10 nm Z9) are also assumed as starting image errors, besides those mentioned above for the scaling, the distortion and the image field curvature. With the correction instruments of the thirteenth exemplary embodiment, a reduction of the merit function to 1.02% of the starting value is obtained. The associated residual image error data are entered in the thirteenth row of Table 1.

In the fourteenth exemplary embodiment, the projection objective 201 has the following correction instruments: A reticle which holds the mask 202 and can be displaced in the direction of the optical axis, lenses 271, 280, 286 and 290 which can be displaced independently in the direction of the optical axis. Assuming the starting image errors according to the thirteenth exemplary embodiment, a reduction of the merit function to 0.82% of the starting value is obtained here. The associated residual image error data are entered in the fourteenth row of Table 1.

In a fifteenth exemplary embodiment, the following correction instruments are provided in the projection objective 201: Lenses 268, 271, 280, 286 and 290 which can be displaced independently in the direction of the optical axis. The reticle 202 is not displaceable. Assuming the starting image errors as in the thirteenth exemplary embodiment, a reduction of the merit function to 0.68% of the starting value is obtained here. The associated residual image error data are entered in the fifteenth row of Table 1.

In the sixteenth exemplary embodiment, the following correction instruments are provided in the projection objective 201: A reticle which holds the mask 202 and can be displaced in the direction of the optical axis, lenses 271, 272, 280 and 284 which can be displaced in the direction of the optical axis. The lenses 271, 272 are displaceable not independently of one another but rather only together as a group.

In the sixteenth exemplary embodiment, the following starting image errors were assumed: 30 ppm scaling, 50 nm third-order distortion and 0.25 μm average image field curvature. After carrying out the correction with the correction instruments of the sixteenth exemplary embodiment, the following residual image errors are obtained as geometrical longitudinal aberrations: a coma at the field edge of 100 nm maximum, a coma in the field zone of 61 nm maximum, a coma in the aperture zone at the field edge of 154 nm maximum, and a variation of the spherical aberration in the image field of 85 nm maximum.

In the seventeenth exemplary embodiment, the following correction instruments are provided in the projection objective 201: A reticle which holds the mask 202 and can be displaced in the direction of the optical axis, lenses 271, 278, 280 and 284 which can be displaced independently in the direction of the optical axis. Assuming the same starting image errors as in the sixteenth exemplary embodiment, the following residual image errors are obtained as geometrical longitudinal aberrations: a coma in the field zone of 15 nm maximum, a coma in the aperture zone at the field edge of 122 nm maximum, and a variation of the spherical aberration in the image field of 48 nm maximum.

In the eighteenth exemplary embodiment, the following correction instruments are provided in the projection objective 201: A reticle which holds the mask 202 and can be displaced in the direction of the optical axis, lenses 271, 280 and 284 which can be displaced independently in the direction of the optical axis, as well as a means of adjusting the wavelength. Assuming starting image errors as in the sixteenth exemplary embodiment, the following residual image errors are obtained as geometrical longitudinal aberrations after the correction by the correction instruments in the eighteenth exemplary embodiment: a coma in the field zone of 7 nm maximum, a coma in the aperture zone at the field edge of 112 nm maximum, and a variation of the spherical aberration in the image field of 123 nm maximum.

As a variant of the first or eleventh exemplary embodiment, in a nineteenth exemplary embodiment the lens of the third lens group LG3 with the maximum diameter may also be provided as a displaceable individual lens, instead of a lens in the vicinity of the transition between the third and fourth lens groups LG3, LG4. This means that the lens 15 would be displaceable instead of the lens 17 in the first exemplary embodiment, and the lens 278 would be displaceable instead of the lens 280 in the eleventh exemplary embodiment.

As a variant of the eighteenth exemplary embodiment, in a twentieth exemplary embodiment a lens in the vicinity of the transition between the second and the third lens groups LG2, LG3 (for example the lens 276 in the direction of the optical axis) may be designed as displaceable instead of a lens in the vicinity of the transition between the first and the second lens groups LG1, LG2 (lens 271 in the eighteenth exemplary embodiment).

In a further variant of the eighteenth exemplary embodiment, instead of the lenses 271, 280 and 284 which are displaceable there, the following lenses can be displaced in the direction of the optical axis in a twenty-first exemplary embodiment: two lenses in the vicinity of the maximum diameter of the third lens group LG3, for example the lenses 278 and 279, and one lens in the vicinity of the transition between the third and the fourth lens groups LG3, LG4, for example the lens 280.

The optimum positions of the individual correction instruments for the image error correction were determined as follows:

Taking the specified starting image errors into account, all possible combinations of the adjustments of the correction instruments were analysed with the aid of a known optical design program, by means of image error specifications and evaluation of a merit function according to the above comments. Combinations of correction instruments were rejected in which a residual image error exceeds a specified upper limit, in which a correction instrument departs from the maximum specified adjustment range, or in which the change of the adjustment of a correction instrument leads to an image-error alteration which lies above a specified limit value for the alteration. The latter case takes into account the limited adjustment accuracy of the correction instruments.

The foregoing description merely explains and illustrates the invention and the invention is not limited thereto except insofar as the appended claims are so limited, as those skilled in the art who have the disclosure before them will be able to make modifications without departing from the scope of the invention.

TABLE 1

| Exemplary embodiment | Disto [nm] | FPD [nm] | AST [nm] | Z7 [nm] | Z9 [nm] | Z10 [nm] | Z12 [nm] | Z14 [nm] | Z16 [nm] | Z17 [nm] | Z25 [nm] |
|---|---|---|---|---|---|---|---|---|---|---|---|
| 1 | 4.66 | 12.74 | 9.29 | 2.36 | 3.17 | 0.37 | 0.23 | 0.57 | 0.41 | 0.03 | 0.06 |
| 2 | 2.21 | 13.13 | 7.50 | 2.07 | 3.19 | 0.37 | 0.21 | 0.49 | 0.42 | 0.03 | 0.06 |
| 3 | 0.35 | 9.90 | 4.75 | 0.54 | 0.35 | 1.00 | 0.70 | 0.95 | 0.86 | 0.04 | 0.11 |
| 4 | 0.29 | 10.40 | 5.04 | 0.39 | 0.28 | 0.51 | 0.56 | 0.76 | 0.74 | 0.03 | 0.10 |
| 5 | 0.32 | 8.30 | 4.03 | 0.41 | 0.28 | 0.54 | 0.48 | 0.64 | 0.74 | 0.03 | 0.09 |
| 6 | 5.6 | 28.08 | 7.2 | 9.97 | 4.36 | 0.39 | 1.11 | 2.35 | 0.95 | 1.02 | 0.78 |
| 7 | 4.43 | 26.4 | 5.77 | 8.74 | 3.51 | 0.36 | 0.98 | 2.04 | 0.87 | 0.89 | 0.68 |
| 8 | 2.23 | 20.9 | 7.9 | 1.27 | 0.88 | 1.09 | 1.18 | 2.44 | 1.57 | 1.42 | 1.21 |
| 9 | 2.32 | 21.1 | 8.3 | 1.06 | 0.83 | 0.47 | 1.13 | 1.98 | 1.41 | 0.96 | 0.76 |
| 10 | 2.34 | 21.71 | 8 | 0.77 | 0.58 | 0.6 | 1.11 | 1.92 | 1.5 | 0.78 | 0.7 |
| 11 | 5.42 | 21.03 | 13.70 | 2.95 | 3.82 | 0.96 | 0.35 | 0.40 | 0.64 | 0.06 | 0.12 |
| 12 | 3.16 | 18.16 | 8.50 | 3.02 | 3.97 | 0.81 | 0.34 | 0.35 | 0.61 | 0.05 | 0.10 |
| 13 | 0.96 | 10.78 | 3.87 | 0.80 | 0.56 | 0.79 | 1.01 | 1.90 | 1.24 | 0.56 | 0.43 |
| 14 | 0.34 | 16.26 | 7.17 | 0.32 | 0.50 | 0.53 | 0.35 | 0.82 | 1.00 | 0.03 | 0.18 |
| 15 | 0.29 | 11.37 | 5.06 | 0.35 | 0.35 | 0.49 | 0.35 | 0.82 | 0.90 | 0.02 | 0.13 |

What is claimed is:

1. A system, comprising:
a mask; and
projection optics, comprising:
a first group of optical components with an overall positive refractive power;
a second group of optical components with an overall negative refractive power;
a third group of optical components with an overall positive refractive power;
a fourth group of optical components with an overall negative refractive power; and
a fifth group of optical components with an overall positive refractive power,
wherein the mask and the groups of optical components comprise:
at least a first, second and third optical subgroup each having at least one optical component that can be displaced along an optical axis of the projection optics, wherein
the first optical subgroup comprises the mask and at least one optical component from the first group of optical components,
the second optical subgroup comprises at least one optical component from the second and third group of optical components, and
the third optical subgroup comprises at least one optical component from the third and fourth group of optical components, and
wherein the system is a microlithography projection exposure system.

2. The system according to claim 1, wherein the second optical subgroup is arranged next to the first group of optical components.

3. The system according to claim 1, wherein the third optical subgroup is arranged in a transition region between the third and fourth groups of optical components.

4. The system according to claim 1, wherein a pair of optical components, whose displacements along the optical axis are expediently coupled together, is provided as the second optical subgroup.

5. The system according to claim 4, wherein that a support body is provided, which can be displaced along the optical axis of the projection optics and which supports the pair of optical components together.

6. The system according to claim 1, wherein an instrument for adjusting a wavelength of the projection light emitted by a light source is provided.

7. The system according to claim 6, wherein the adjustment instrument includes means for altering the wavelength of the projection light emitted by the light source.

8. The system according to claim 6, wherein the adjustment instrument includes means for altering the wavelength of the projection light emitted by the light source after exiting the light source.

9. The system according to claim 1, comprising at least one further optical subgroup, having at least one optical component, which can be displaced along the optical axis of the projection optics and which comprises at least one optical component from the fifth group of optical components.

10. The system according to claim 1, comprising an at most fourth and fifth optical subgroup which can be displaced along the optical axis of projection optics.

11. The system according to claim 1, wherein the optical components are designed as refractive components.

12. A system, comprising:
a mask; and
projection optics, comprising:
a first group of optical components with an overall positive refractive power;
a second group of optical components with an overall negative refractive power;
a third group of optical components with an overall positive refractive power;
a fourth group of optical components with an overall negative refractive power; and
a fifth group of optical components with an overall positive refractive power, wherein the mask and the groups of optical components comprise:
at least a first and second optical subgroup, the first and second optical subgroups each having at least one optical component that can be displaced along an optical axis of the projection optics, and
wherein:
during use, light passes through the system along an optical path;
the second group of optical components is between the first group of optical components and the third group of optical components along the optical path;
the third group of optical components is between the second group of optical components and the fourth group of optical components along the optical path;
the fourth group of optical components is between the third group of optical components and the fifth group of optical components along the optical path;
the first optical subgroup comprises the mask and at least one optical component from the first group of optical components;
the second optical subgroup comprises at least one optical component from the second and third group of optical components; and
the system is a microlithography projection exposure system.

13. A system, comprising:
a mask; and
projection optics, comprising:
a first group of optical components with an overall positive refractive power;
a second group of optical components with an overall negative refractive power;
a third group of optical components with an overall positive refractive power;
a fourth group of optical components with an overall negative refractive power; and
a fifth group of optical components with an overall positive refractive power, wherein the mask and the groups of optical components comprise:
at least a first and second optical subgroup, the first and second optical subgroups each having at least one optical component that can be displaced along an optical axis of the projection optics, and
wherein:
during use, light passes through the system along an optical path;
the second group of optical components is between the first group of optical components and the third group of optical components along the optical path;
the third group of optical components is between the second group of optical components and the fourth group of the fourth group of optical components is between the third group of optical components and the fifth group of optical components along the optical path;

the first optical subgroup comprises at least one optical component from the second and third group of optical components;

the second optical subgroup comprises at least one optical component from the third and fourth group of optical components; and the system is a microlithography projection exposure system.

14. A system, comprising:

a mask; and projection optics, comprising:

a first group of optical components with an overall positive refractive power;

a second group of optical components with an overall negative refractive power;

a third group of optical components with an overall positive refractive power;

a fourth group of optical components with an overall negative refractive power; and and a fifth group of optical components with an overall positive refractive power, wherein the mask and the groups of optical components comprise:

at least a first and second optical subgroup, the first and second optical subgroups each having at least one optical component that can be displaced along an optical axis of the projection optics, wherein:

during use, light passes through the system along an optical path;

the second group of optical components is between the first group of optical components and the third group of optical components along the optical path;

the third group of optical components is between the second group of optical components and the fourth group of optical components along the optical path;

the fourth group of optical components is between the third group of optical components and the fifth group of optical components along the optical path;

the first optical subgroup comprises the mask and at least one optical component from the first group of optical components;

the second optical subgroup comprises at least one optical component from the third and fourth group of optical components; and the system is a microlithography projection exposure system.

* * * * *

UNITED STATES PATENT AND TRADEMARK OFFICE
CERTIFICATE OF CORRECTION

PATENT NO. : 7,408,621 B2  
APPLICATION NO. : 11/396051  
DATED : August 5, 2008  
INVENTOR(S) : Kneer et al.

It is certified that error appears in the above-identified patent and that said Letters Patent is hereby corrected as shown below:

In column 3, line 32, delete "6,349.005" and insert -- 6,349,005 --, therefor.

In column 4, line 4–5, after "components" insert -- . --.

In column 6, line 26, delete "A" and insert -- A, --, therefor.

In column 7, line 52, delete "A" and insert -- A, --, therefor.

In column 13, line 23, in claim 14, before "a fifth" delete "and".

Signed and Sealed this

Fourth Day of November, 2008

JON W. DUDAS  
*Director of the United States Patent and Trademark Office*

UNITED STATES PATENT AND TRADEMARK OFFICE
CERTIFICATE OF CORRECTION

PATENT NO. : 7,408,621 B2 Page 1 of 1
APPLICATION NO. : 11/396051
DATED : August 5, 2008
INVENTOR(S) : Bernhard Kneer and Gerald Richter It is certified that error appears in the above-identified patent and that said Letters Patent is hereby corrected as shown below:

Column 1, line 33, delete "2003/1498551 A1", insert --2002/0149855 A1--.

Column 6, line 26, delete "2003/1498551 A Table 4", insert --2002/0149855 A1--.

Column 7, line 52, delete "2003/1498551 A Table 1", insert --2002/0149855 A1--.

Signed and Sealed this

Tenth Day of February, 2009

JOHN DOLL
*Acting Director of the United States Patent and Trademark Office*